US009099237B2

(12) United States Patent
Balcerak et al.

(10) Patent No.: US 9,099,237 B2
(45) **Date of Patent: *Aug. 4, 2015**

(54) MODULAR LIQUID COOLING SYSTEM

(75) Inventors: John A. Balcerak, Muskego, WI (US); Jeremy J. Keegan, Kewaskum, WI (US); William K. Siebert, West Bend, WI (US); Neil Gollhardt, Fox Point, WI (US); Scott D. Day, Richfield, WI (US)

(73) Assignee: ROCKWELL AUTOMATION TECHNOLOGIES, INC., Mayfield Height, OH (US)

( * ) Notice: Subject to any disclaimer, the term of this patent is extended or adjusted under 35 U.S.C. 154(b) by 790 days.

This patent is subject to a terminal disclaimer.

(21) Appl. No.: 13/330,058

(22) Filed: Dec. 19, 2011

(65) Prior Publication Data

US 2012/0085524 A1 Apr. 12, 2012

Related U.S. Application Data

(63) Continuation of application No. 11/854,818, filed on Sep. 13, 2007, now Pat. No. 8,081,462.

(51) Int. Cl.

| | |
|---|---|
| ***H05K 7/20*** | (2006.01) |
| ***H01F 27/10*** | (2006.01) |
| *H01L 23/473* | (2006.01) |
| *H01F 27/32* | (2006.01) |

(52) U.S. Cl.

CPC .............. *H01F 27/10* (2013.01); *H01F 27/322* (2013.01); *H01F 27/325* (2013.01)

(58) Field of Classification Search

CPC ............ H05K 7/20218–7/20381; H01I 23/473
USPC ............... 361/679.46–679.54, 688–723, 676, 361/618, 620, 677; 165/80.4–80.5, 104.33, 165/185; 174/15.1–15.3, 16.1–16.3, 174/547–548; 257/712–722, E23.088; 336/55, 57, 60, 192, 198, 208
See application file for complete search history.

(56) References Cited

U.S. PATENT DOCUMENTS

| | | | | |
|---|---|---|---|---|
| 2,942,165 | A | 6/1960 | Jackson et al. | |
| 3,788,393 | A | 1/1974 | Plizak | |
| 4,902,998 | A | 2/1990 | Pollard | |
| 4,956,626 | A * | 9/1990 | Hoppe et al. | 336/60 |

(Continued)

OTHER PUBLICATIONS

U.S. Appl. No. 11/854,818. Non-Final Rejection dated Aug. 18, 2009. pp. 1-14.

(Continued)

*Primary Examiner* — Anthony Haughton
*Assistant Examiner* — Razmeen Gafur
(74) *Attorney, Agent, or Firm* — Quarles & Brady LLP

(57) ABSTRACT

Cooling systems include a first passageway forming member that includes first and second ends and at least one connecting recess that opens into first and second passageways formed by the first passageway forming member. A second passageway forming member includes first and second ends and inlet and outlet ports proximate the first end such that the first end, including an elastomeric seal and the inlet and outlet ports, is sealably insertable in and removable from the at least one connecting recess, where the inlet port opens into the first passageway and the outlet port opens into the second passageway, and where, when the first end is inserted in the at least one connecting recess, the elastomeric seal is sandwiched between and in substantial contact with both the first end and the first passageway forming member.

19 Claims, 13 Drawing Sheets

(56) References Cited

U.S. PATENT DOCUMENTS

| | | | | |
|---|---|---|---|---|
| 4,977,444 | A | 12/1990 | Nakajima et al. | |
| 5,161,089 | A | 11/1992 | Chu et al. | |
| 5,170,319 | A | 12/1992 | Chu et al. | |
| 5,174,373 | A | 12/1992 | Shinmura | |
| 5,274,920 | A | 1/1994 | Matthews | |
| 5,349,498 | A | 9/1994 | Tanzer et al. | |
| 5,383,517 | A | 1/1995 | Dierbeck | |
| 5,526,231 | A | 6/1996 | Arz et al. | |
| 5,930,135 | A | 7/1999 | Janko | |
| 5,978,220 | A | 11/1999 | Frey et al. | |
| 6,031,751 | A | 2/2000 | Janko | |
| 6,137,169 | A | 10/2000 | Pace | |
| 6,161,616 | A | 12/2000 | Haussmann | |
| 6,173,760 | B1 | 1/2001 | Gardell et al. | |
| 6,236,566 | B1 | 5/2001 | Regnier | |
| 6,252,771 | B1 | 6/2001 | Jordan | |
| 6,394,176 | B1 | 5/2002 | Marsais | |
| 6,462,949 | B1 | 10/2002 | Parish et al. | |
| 6,467,535 | B1 | 10/2002 | Shembekar et al. | |
| 6,536,510 | B2 | 3/2003 | Khrustalev et al. | |
| 6,819,561 | B2 | 11/2004 | Hartzell et al. | |
| 6,839,234 | B2 | 1/2005 | Niwatsukino et al. | |
| 6,935,414 | B2 | 8/2005 | Kawakubo et al. | |
| 6,966,359 | B1 | 11/2005 | Liu | |
| 7,031,161 | B2 | 4/2006 | Miettinen et al. | |
| 7,068,507 | B2 | 6/2006 | Pfeifer et al. | |
| 7,129,808 | B2 * | 10/2006 | Roebke et al. | 336/55 |
| 7,173,823 | B1 | 2/2007 | Rinehart et al. | |
| 7,212,406 | B2 * | 5/2007 | Kaishian et al. | 361/699 |
| 7,227,754 | B2 | 6/2007 | Griesinger et al. | |
| 7,490,659 | B2 | 2/2009 | Kwon et al. | |
| 7,757,753 | B2 | 7/2010 | Yanik et al. | |
| 7,893,804 | B2 * | 2/2011 | Ahangar et al. | 336/60 |
| 8,009,004 | B2 * | 8/2011 | Ahangar et al. | 336/60 |
| 8,151,868 | B2 * | 4/2012 | Inagaki | 165/80.4 |
| 8,291,967 | B2 * | 10/2012 | Yoshida et al. | 165/80.4 |
| 8,488,321 | B2 * | 7/2013 | Brandenburg et al. | 361/699 |
| 2002/0040776 | A1 | 4/2002 | Kokubunji et al. | |
| 2002/0053421 | A1 | 5/2002 | Hisano et al. | |
| 2004/0020231 | A1 * | 2/2004 | Nakamura et al. | 62/259.2 |
| 2004/0026072 | A1 | 2/2004 | Yi et al. | |
| 2004/0159121 | A1 | 8/2004 | Horiuchi et al. | |
| 2005/0006068 | A1 | 1/2005 | Desai et al. | |
| 2005/0061488 | A1 | 3/2005 | Yu et al. | |
| 2005/0133210 | A1 | 6/2005 | Inagaki et al. | |
| 2005/0217839 | A1 | 10/2005 | Papapanu | |
| 2005/0249609 | A1 | 11/2005 | Ito et al. | |
| 2006/0044103 | A1 | 3/2006 | Roebke et al. | |
| 2006/0044742 | A1 | 3/2006 | Kaishian et al. | |
| 2006/0098409 | A1 | 5/2006 | Cheon | |
| 2006/0120047 | A1 | 6/2006 | Inoue | |
| 2007/0034354 | A1 * | 2/2007 | Tung et al. | 165/80.4 |
| 2007/0084585 | A1 * | 4/2007 | Takagi et al. | 165/80.4 |
| 2008/0000625 | A1 * | 1/2008 | Baylis et al. | 165/173 |
| 2008/0023185 | A1 * | 1/2008 | Beamer et al. | 165/174 |
| 2008/0023186 | A1 | 1/2008 | Beamer et al. | |
| 2008/0174393 | A1 | 7/2008 | Schnetzka et al. | |
| 2009/0008061 | A1 | 1/2009 | Inagaki et al. | |
| 2009/0065178 | A1 * | 3/2009 | Kasezawa et al. | 165/104.19 |
| 2009/0065182 | A1 * | 3/2009 | Takahashi et al. | 165/104.33 |
| 2009/0250195 | A1 * | 10/2009 | Yoshida et al. | 165/80.3 |
| 2010/0079956 | A1 * | 4/2010 | Ibori et al. | 361/703 |
| 2010/0157526 | A1 * | 6/2010 | Beaupre et al. | 361/689 |
| 2010/0290490 | A1 * | 11/2010 | Hammel et al. | 372/36 |
| 2010/0296249 | A1 * | 11/2010 | Li | 361/700 |
| 2010/0315782 | A1 * | 12/2010 | Pautsch et al. | 361/702 |

OTHER PUBLICATIONS

U.S. Appl. No. 11/854,818. Final Rejection dated Mar. 31, 2010. pp. 1-17.

U.S. Appl. No. 11/854,818. Non-Final Rejection mailed Nov. 26, 2010. pp. 1-17.

U.S. Appl. No. 11/854,818. Final Rejection mailed Apr. 1, 2011. pp. 1-19.

U.S. Appl. No. 11/854,818. Examiner Interview Summary Record dated May 9, 2011. pp. 1-3.

U.S. Appl. No. 11/854,818. Notice of Allowance and Fees Due dated Aug. 5, 2011. pp. 1-10.

* cited by examiner 14a
44
4d
58
56
52
4f
57
4e
18
59
48
46

MODULAR LIQUID COOLING SYSTEM

CROSS-REFERENCE TO RELATED APPLICATIONS

This application is a continuation of U.S. patent application Ser. No. 11/854,818, filed Sep. 13, 2007 now U.S. Pat. No. 8,081,462, and entitled "Modular Liquid Cooling System," which is hereby incorporated by reference.

STATEMENT REGARDING FEDERALLY SPONSORED RESEARCH

Not Applicable.

TECHNICAL FIELD

The field of the invention is liquid cooling systems and methods for cooling electrical components forming electrical control equipment.

BACKGROUND

Electronics and electrical components generate heat when they operate. In at least some applications heat generated by electrical components can cause damage to those components if the heat becomes excessive. Component heating problems are exacerbated when electronic components are operated in extremely hot environments and/or when the components need to be enclosed (e.g., in a sealed compartment) during operation. For instance, in military vehicles that operate in desert conditions, ambient temperatures in excess of 100 degrees are typical and components often have to be enclosed to protect the components from dust, sand and other airborne debris.

To deal with electronics heating problems, the electronics industry has developed various types of electronics cooling systems including, among others, liquid cooling systems. Typical liquid cooling systems include mechanical tubing or pipe configurations that form channels for directing cooling liquid along paths adjacent heat generating components. Heat from components is dissipated into the cooling liquid and is carried away from the components that generate the heat.

While liquid cooling systems have worked well in many applications, unfortunately the costs associated with manufacturing the mechanical liquid channeling configurations in both materials and labor has been excessive for many applications. To this end, see FIGS. 10 and 11 in U.S. Pat. No. 7,129,808 which issued on Oct. 31, 2006 and that is titled "Core Cooling For Electrical Components" which illustrates a complex circuitous copper tubing arrangement for delivering cooling liquid to components to be cooled where the arrangement includes a large number of components and requires a large amount of skilled labor to assemble.

What is needed is a method and apparatus for configuring liquid cooling systems for electronic and other heat generating components that includes components that are simple to manufacture and that are easy and quick to connect so that minimal skill and time is required to configure cooling assemblies. It would be advantageous if such components were able to be used to configure many different cooling assemblies.

SUMMARY OF THE INVENTION

The invention relates to a liquid cooling system for cooling various electrical components or modules using a liquid coolant. The cooling system includes modular components such as split-flow tubes, split flow manifolds, and single flow manifolds, which are connected together using simply constructed connection pieces and O-rings. The modular nature of these components and the connection pieces allows for the easy assembly and disassembly of these components, and allows for various configurations to be easily constructed to cool different types and numbers of electrical components or modules. In at least some embodiments the manifolds are formed using an extrusion process followed by a machining process to form mounting surfaces, threaded bolt receiving apertures and liquid flow ports which operate as inlet or outlet ports. In at least some embodiments, metallic insert plugs are secured within manifold passageways to close those passageways off at distal ends. The cooling system optimizes the coolant flow path and therefore the power flow, and can accommodate high pressure liquid coolants.

The manifold designs contemplated here allow the cooling system to be manufactured separately from the electrical components and then assembled with the electrical components. Further, this modular cooling system lowers the losses due to heat, reduces internal enclosure temperature, can cause conditions that enable smaller electronic and other components to be used to achieve the same operational output, and allows for lower temperature rated components to be used. Other advantages include a reduction in the heat load of internal devices, the use of smaller components such as inductors due to increased allowable flux density, smaller cores and smaller coil wire size. The cooling system can result in smaller systems, which reduces shipping weight, required package structural strength, and material mass. All of these factors translate to decreased cost.

Consistent with the above, at least some inventive embodiments include a kit of components for configuring electronics cooling configurations, the kit comprising a plurality of passageway forming members, each forming member including an extruded member having first and second ends and forming at least one passageway and at least one of an input port and an output port that opens into the passageway, each forming member also including at least one plug insert secured to the second end of the forming member to block the at least one passageway, a plurality of elastomeric seals, a plurality of mechanical fasteners, wherein forming members can be arranged adjacent each other with ports aligned and the fasteners can be used to mechanically fasten the forming members together with seals there between to form various cooling configurations.

In some cases at least a first of the forming members includes first and second passageways. In some cases the first forming member includes an inlet into the first passageway and an outlet that opens into the second passageway and wherein the first and second passageways are completely separate. In some cases the inlet and outlet into the first and second passageways, respectively, open to the same side of the first and second passageways. In some cases the first and second passageways are substantially parallel.

In some cases the first forming member includes first and second plug inserts at the first and second ends for blocking passageways. In some cases at least a second of the forming members includes first and second passageways, a bridge passageway adjacent the second end that links the first and second passageways and an inlet into the first passageway and an outlet into the second passageway where the inlet and outlet are both proximate the first end of the forming member. In some cases the inlet and outlet that open into the first and second passageways formed by the second forming member open in opposite directions. In some cases the first forming member includes at least one connecting recess that opens into the first and second passageways formed by the first forming member wherein, when the first end of the second forming member is received in the connecting recess, the inlet and outlet of the second forming member open into the first and second passageways formed by the first forming member.

In some cases the first forming member includes a plurality of connecting recesses that open into the first and second passageways formed by the first forming member wherein each of the connecting recesses can receive a first end of a second forming member so that the inlet and outlet of the received second forming member opens into the first and second passageways formed by the first forming member. In some cases the first forming member includes first and second oppositely facing surfaces and wherein the inlet and outlet are formed in the first surface and the connecting recess is formed in the second surface.

In some cases at least a subset of the forming members form a single passageway and include both an inlet and an outlet that open into the single passageway. In some cases the passageways are formed along lengths of the forming members and wherein each of the forming members includes at least one of an inlet and an outlet that opens through a side wall portion of the forming member into at least one of the passageways. In some cases at least a subset of the forming members include external surfaces that form O-ring receiving cannels for receiving elastomeric seals when two forming members are secured together.

In some cases at least a subset of the forming members are substantially rectilinear in cross section. In some cases at least one of the forming members includes first and second passageways, a bridge passageway adjacent the second end that links the first and second passageways and an inlet into the first passageway and an outlet into the second passageway where the inlet and outlet are both proximate the first end of the forming member.

In some cases the kit is for use in cooling at least one electrical component, the electrical component including a coil having a plurality of turns disposed over at least one of the passageway forming members.

Other embodiments include a method of configuring a cooling assembly, the method comprising the steps of extruding a first manifold member that forms at least one manifold passageway that is defined at least in part by a first manifold wall member where the first manifold wall member forms a first external surface, extruding a second manifold member that forms at least one passageway that is defined at least in part by a second manifold wall member where the second manifold wall member forms a second external surface, forming a first port in the first manifold wall member that opens into the passageway formed by the first manifold, forming a second port in the second manifold wall member that opens into the passageway formed by the second manifold, providing an elastomeric seal on the first external surface that surrounds the first opening and securing the second manifold member to the first manifold member with the first and second openings aligned and the seal sandwiched between the first and second external surfaces.

Some methods further include the step of forming a circular recess in the first external surface and wherein the step of providing an elastomeric seal includes placing the elastomeric O-ring in the circular recess. In some cases the passageway formed by the first manifold includes first and second ends and wherein the method further includes the step of securing a plug insert into at least the first end of the passageway to close the passageway formed by the first manifold. In some cases the step of extruding a second manifold includes extruding a second manifold that forms first and second manifold passageways and wherein the step of forming a second port includes forming the second port so that the second port only opens into the first passageway formed by the second manifold.

Some methods further include the step of forming a third port in the second manifold where the third port opens into the second passageway formed by the second manifold. In some cases the third port also opens into the first passageway formed by the second manifold.

Still other embodiments include a method of forming a split flow tube comprising the steps of extruding a tube member that includes first and second passageways separated by an internal wall member where the tube member includes first and second ends, plugging the first and second passageways proximate the first end, removing a portion of the internal wall member proximate the second end of the tube member, plugging the second end of the tube member with a plug insert where the plug insert is dimensioned so that a bridge passageway is formed between the insert and an adjacent edge of the internal wall member and forming inlet and outlet ports in the tube proximate the first end where the inlet port opens into the first passageway and the outlet port opens into the second passageway.

In some cases the step of extruding a tube member includes extruding a tube member that has a substantially D-shaped cross section. Some methods further include the step of, prior to forming the inlet and outlet ports, removing a portion of the tube adjacent the first end to form a cylindrical connection head portion through which the first and second passageways pass, the step of forming the inlet and outlet ports including forming the ports in the head portion. Some methods further include the step of forming an annular recess for receiving an O-ring in the head portion on a side of the ports opposite the first end of the tube.

Still other embodiments include a modular cooling system. The system comprises at least a first passageway forming member and a second passageway forming member, each of the first and second passageway forming members having first and second ends and forming at least one passageway and at least one of an input port and an output port that opens into the passageway. The second passageway forming member includes first and second passageways, a bridge passageway adjacent the second end of the second passageway forming member that links the first and second passageways and an inlet into the first passageway and an outlet into the second passageway, where the inlet and outlet are both proximate the first end of the second forming member. The first passageway forming member includes at least one connecting recess that opens into the first and second passageways formed by the first passageway forming member, the first end of the second passageway forming member being receivable in the connecting recess, such that the inlet and outlet of the second passageway forming member open into the at least one passageway formed by the first forming member when the first end of the second passageway forming member is received in the connecting recess.

Yet other embodiments include a modular liquid cooling system. The system comprises an extruded tube member, the tube member forming first and second passageways and an internal wall member, the internal wall member separating the first and second passageways, where the tube member includes first and second ends. An elastomeric seal is included that is proximate to and surrounds the first end. A plug insert is included at the second end of the tube member, where the plug insert is dimensioned so that a bridge passageway is formed between the plug insert and an adjacent edge of the internal wall member. Inlet and outlet ports are included in the tube member proximate the first end such that the first end, including the elastomeric seal and the inlet and outlet ports, is sealably insertable in and removable from a respective port in a passageway forming member, where the inlet port opens into the first passageway and the outlet port opens into the second passageway, and where, when the first end is inserted in the port in the passageway forming member, the elastomeric seal is sandwiched between and in substantial contact with both the first end and the passageway forming member.

Yet other embodiments include a cooling system. The system comprises a first passageway forming member including first and second ends and at least one connecting recess that opens into first and second passageways formed by the first passageway forming member, and a second passageway forming member that includes first and second ends and inlet and outlet ports proximate the first end such that the first end, including an elastomeric seal and the inlet and outlet ports, is sealably insertable in and removable from the at least one connecting recess, where the inlet port opens into the first passageway and the outlet port opens into the second passageway, and where, when the first end is inserted in the at least one connecting recess, the elastomeric seal is sandwiched between and in substantial contact with both the first end and the first passageway forming member.

These and other objects and advantages of the invention will be apparent from the description that follows and from the drawings which illustrate embodiments of the invention, and which are incorporated herein by reference.

DETAILED DESCRIPTION

Figure 1:
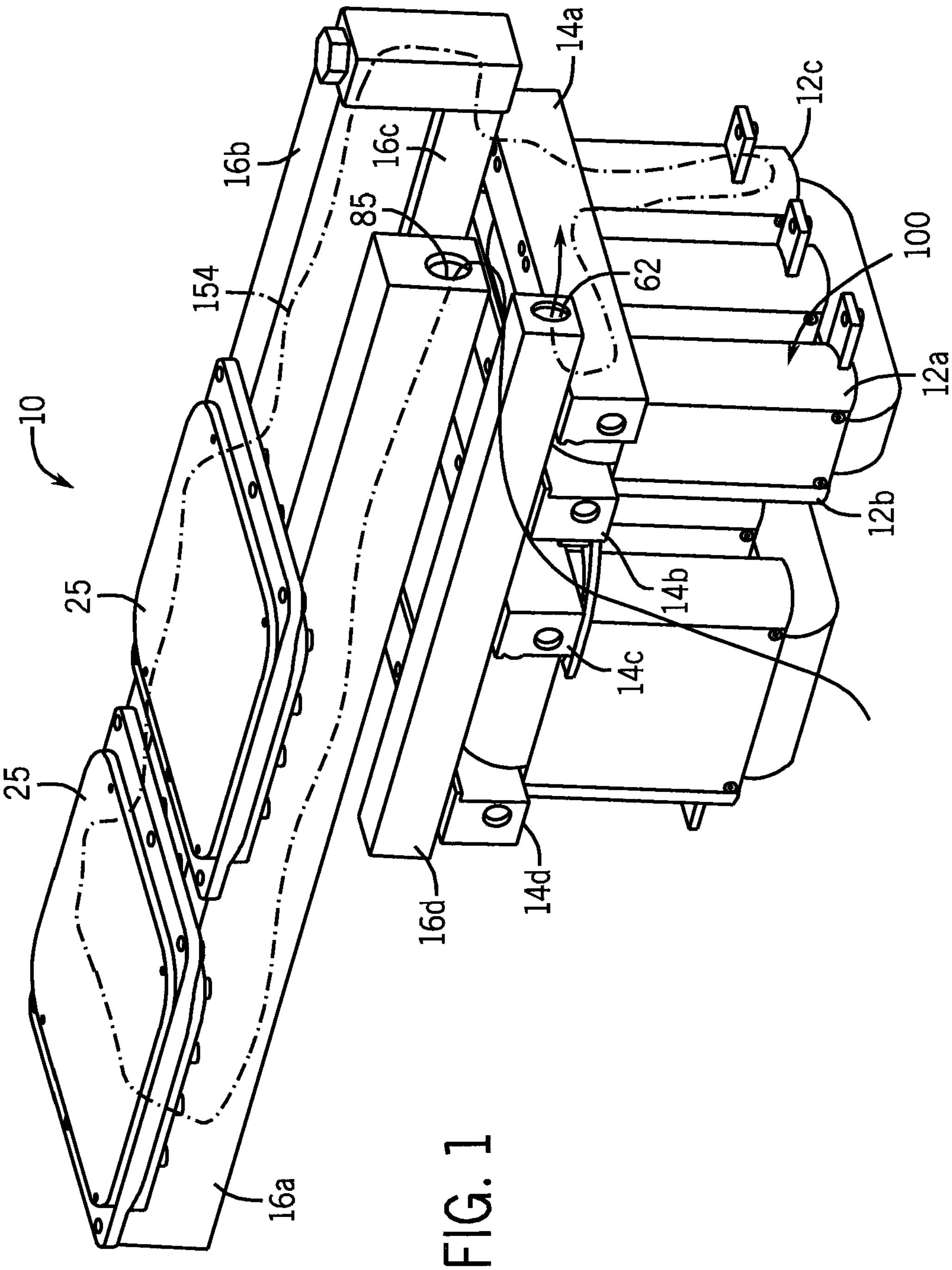
FIG. 1 is a perspective view of an exemplary cooling system constructed using components that are consistent with at least some aspects of the present invention.

Referring now to the drawings wherein like reference numeral correspond to similar elements throughout the several views and, more specifically, referring to FIGS. 1-12, the construction of and components of one embodiment of a cooling system 10 that is consistent with at least some aspects of the present invention for cooling one or more electrical components, such as an inductor assembly (not shown in FIGS. 1-12) and IGBT modules 25 is illustrated. Second, exemplary inductor/cooling system 11 consistent with at least some inventive aspects is shown in FIGS. 13*a* through 13*c* and will be described in greater detail below.

Figure 2:
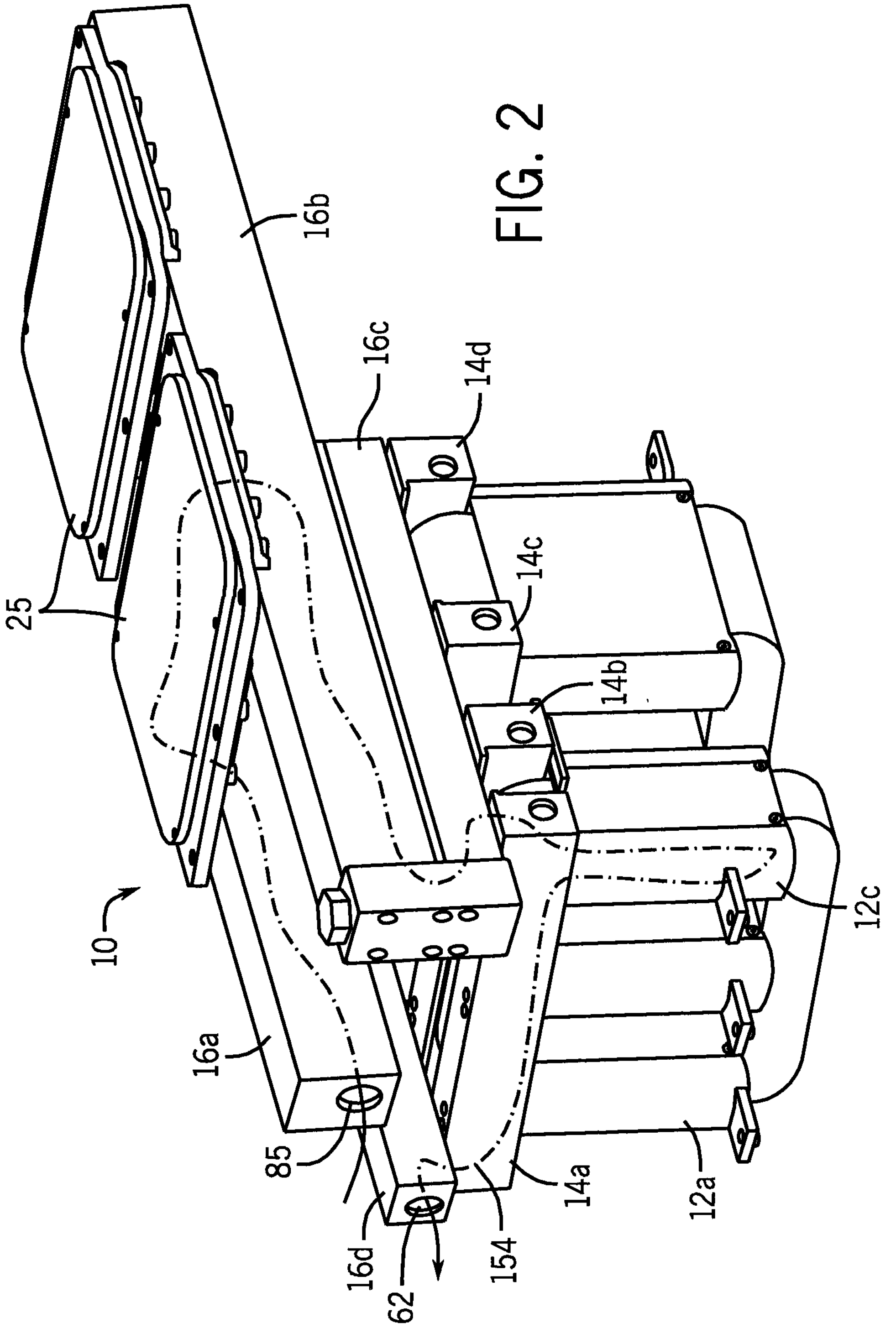
FIG. 2 is similar to FIG. 1, albeit from a different vantage point.

In FIGS. 1 and 2, cooling system 10 includes components for directing flow of a liquid coolant, such as closed end split flow tubes 12*a*, 12*b*, 12*c*, etc., that together with separator plates 102 and 104, form inductor bobbins 100, split flow manifolds 14*a*, 14*b*, 14*c* and 14*d*, and single flow manifolds 16*a*, 16*b*, 16*c* and 16*d* which operate as source or return manifolds. Here, the manifolds and tubes are collectively referred to as passageway forming members. As further explained below, the tubes and manifolds (i.e., passage forming members) are modular in nature and can be connected together in various ways to achieve both serial and parallel flow of liquid coolant to provide cooling to electrical components.

In at least some embodiments, manifolds 14*a*-14*d* and 16*a*-16*d*, are constructed as extruded pieces with additional ports and other features (e.g., mounting surfaces, fastening apertures, etc.) being machined therein. Similarly, split flow tubes 12*a*, 12*b*, 12*c*, etc., that form bobbin end pieces for inductor windings (not shown in FIGS. 1-12) are formed via an extrusion process followed by machining to form functional features including a connection head portion 26 that has inlet or input and outlet or output ports 32 and 34, respectively. Cooling system 10 also includes plugs 18 (see FIGS. 3, 4*e*, 5*e*, etc.) and O-rings 22 (see FIG. 3) to facilitate hermetically sealed connectivity, and bolts for fastening system components together.

Figure 8:
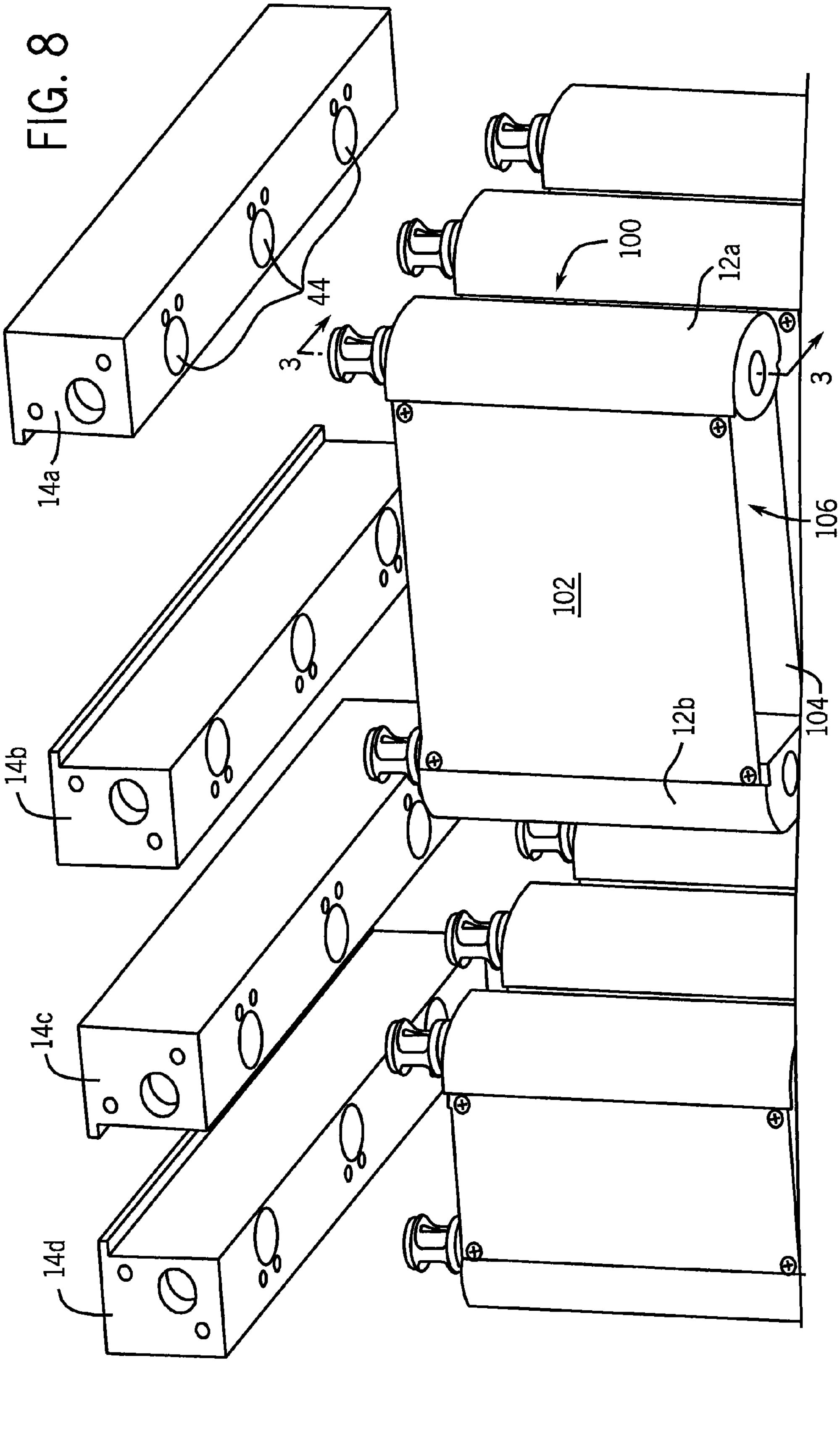
FIG. 8 is a perspective view showing a plurality of bobbin assemblies and split flow manifolds that are consistent with at least some aspects of the present invention.
Figure 9:
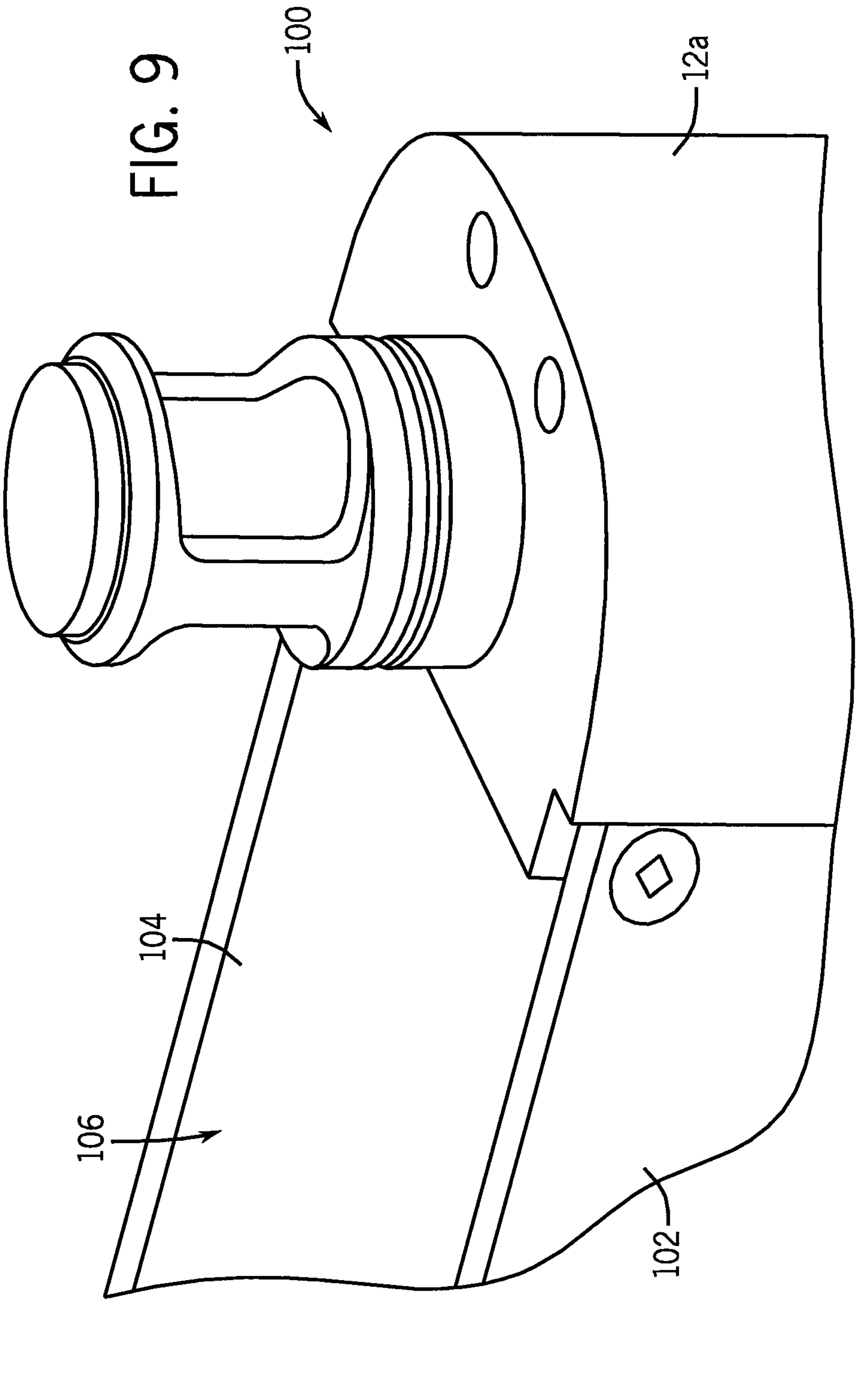
FIG. 9 is an enlarged perspective view of one of the connection portions of one of the bobbin end pieces shown in FIG. 8.

Referring to FIGS. 1, 8 and 9, an inductor bobbin 100 around which an inductor coil 38 (see FIGS. 13*a* and 13*b*) may be wound in at least some inventive embodiments includes two split flow tubes 12*a* and 12*b* and two separator plates 102 and 104 that are secured via screws to the bobbin end pieces to, as the label implies, space apart the two bobbins to form a core receiving space 106. End pieces 12*a* and 12*b* are similarly constructed and operate in a similar fashion and therefore, in the interest of simplifying this explanation, only piece 12*a* will be described here in detail.

Figure 3:
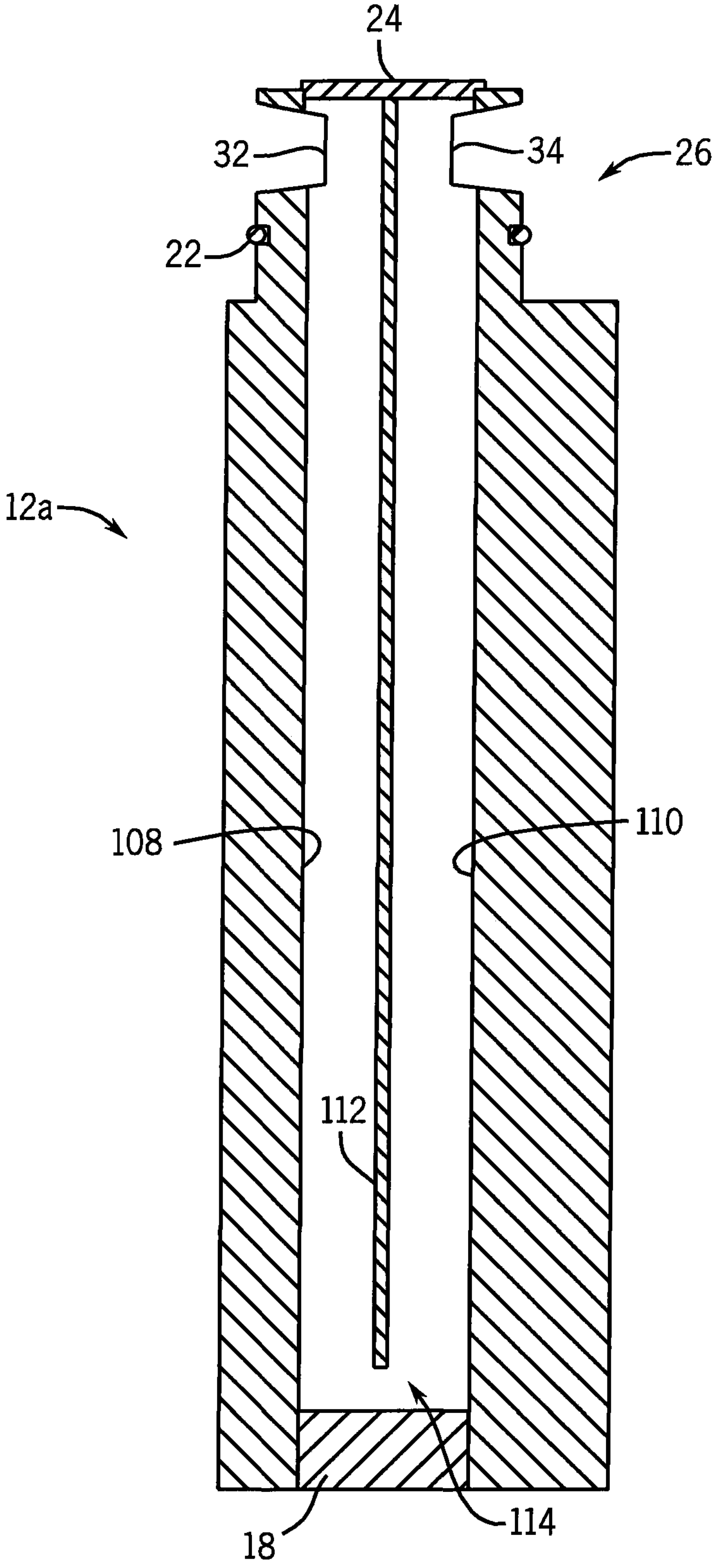
FIG. 3 is a cross-sectional view taken along the line 3-3 in FIG. 8 showing internal passageways of an exemplary bobbin end piece.

Referring to FIGS. 13*c* and 3, end piece 12*a* has a generally D-shaped cross-section along most of its length and forms first and second parallel passageways 108 and 110 along its length dimension and a connection head portion 26 at a top or first end. Piece or tube 12*a* is formed by first extruding a two passageway member having a uniform D-shaped cross-section and then machining off the portion of the extruded member at the head portion end to form head portion 26. Head portion 26 is generally cylindrically shaped and forms an O-ring recess around a neck portion for receiving an elastomeric O-ring 22. Input/inlet and output/outlet ports 32 and 34, respectively, are machined into opposite sides of connection head portion 26 where port 32 opens into first passageway 108 and port 34 opens into second passageway 110.

At the end of tube 12*a* opposite head portion 26 the wall 112 that separates passageways 108 and 110 is machined off and a metallic plug insert 18 is laser welded in the passageway to close off that end of the tube. Here, the insert 18 stops short of the passageway separating wall so that a bridging passageway 114 is formed between passageways 108 and 110.

At the head portion end of tube 12*a* wall 112 is machined off and an elastomeric gasket 24 is frictionally received within the resulting passageway end to close off that end. Once installed a surface of a passageway formed by a manifold is pressed against the top surface of gasket 24 to hold the gasket 24 in place.

Thus, the inflow portion and the outflow portion of split flow tube 12*a* together form a continuous U-shaped tube passageway through which liquid coolant may flow. The connection head portion 26 of the split flow tube 12 is configured to be insertable in and removable from a respective connecting portion formed as a recess 44 of a respective split flow manifold, with O-ring 22 and gasket 24 providing a fluid tight connection between the connected components.

Referring again to FIGS. 1 and 2, each of split flow manifolds 14*a*-14*d* is similarly constructed and operates in a similar fashion and therefore only manifold 14*a* will be described here in detail in the interest of simplifying this explanation. Referring to FIGS. 4*a*-4*f*, manifold 14*a* is generally rectangular in cross-section and forms first and second parallel passageways 46 and 48 along its length. As in the case of split flow tube 12*a* described above, manifold 14*a* is formed via an extrusion process to form the rectilinear cross-section and parallel passageways 46, 48. Thereafter, inlet and outlet ports and threaded mounting apertures are formed via a machining process. In the illustrated embodiment an inlet port 52 is formed in a top surface or manifold wall member of manifold 14*a* where port 52 opens into passageway 46 and an outlet port 56 is formed in the top surface that opens into passageway 48. Circular O-ring receiving recesses 58 are formed around each of the inlet and outlet ports 52 and 56 on the top surface. In addition, three outlet/inlet ports or connecting recesses collectively identified by numeral 44 are formed in a bottom surface of manifold 14*a* opposite the top surface where each of the outlet/inlet ports 44 opens into both passageways 46 and 48 (see also FIG. 8). Each port 44 includes a flat end surface 57 (see FIG. 4*d*).

Outlet/inlet ports 44 are formed to receive connection head portions 26 (see again FIGS. 3 and 9) of the split flow tubes/bobbin end pieces. To this end, ports 44 are formed so that when a head portion 26 is received therein, a top surface of gasket 24 contacts end surface 57 (see FIG. 9*d*) of the receiving port 44 to seal portion 26 to the end surface 57 and so that the O-ring 22 (see FIG. 2) is sandwiched between the head portion 26 and a facing surface of the port 44. When properly positioned, port 32 opens into manifold passageway 46 and port 34 opens into manifold passageway 48 so that a continuous and sealed flow path is formed from passageway 46 in manifold 14*a* through port 32 into first tube passageway 108, through tube bridging passageway 114 to second tube passageway 110, through tube port 34 into manifold passageway 48 to manifold outlet port 56.

Figures 4A, 4B, 4C, 4D, 4E, 4F:
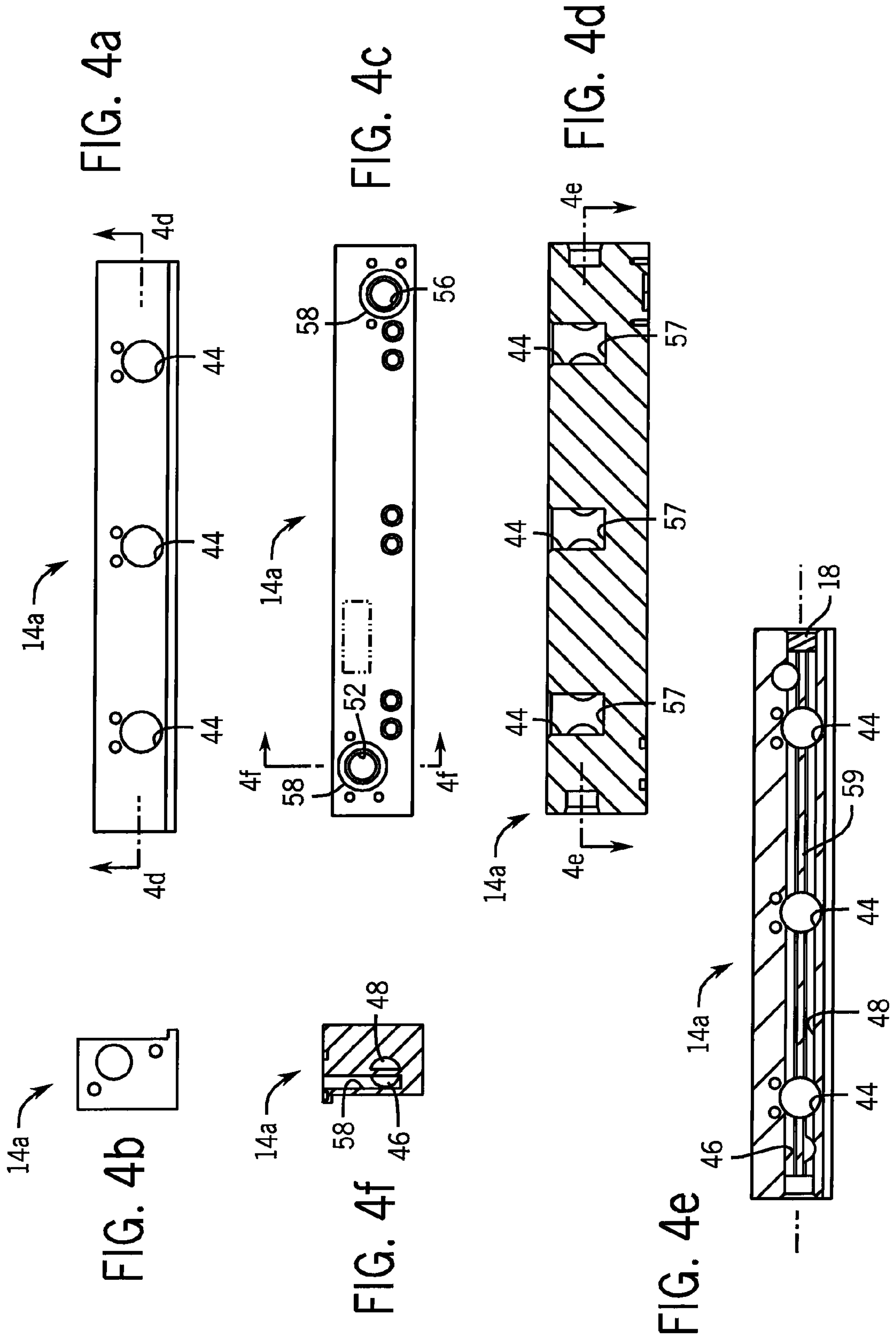
FIG. 4*a* is a bottom plan view of the split flow manifold shown in FIG. 1.
FIG. 4*b* is an end plan view of the manifold shown in FIG. 4*a*.
FIG. 4*c* is a top plan view of the manifold of FIG. 4*a*.
FIG. 4*d* is a cross-sectional view taken along the line 4*d*-4*d* of FIG. 4*a*.
FIG. 4*e* is a cross-sectional view taken along the line 4*e*-4*e* in FIG. 4*d*, albeit where a passageway closing insert has been installed.
FIG. 4*f* is a cross-sectional view taken along the line 4*f*-4*f* of FIG. 4*c;*

Referring to FIG. 4*e*, metallic plug inserts 18 are provided at opposite ends of the passageways 46 and 48 to close off each of these passageways. Here, each insert 18 is dimensioned so that an internal surface thereof abuts an adjacent end of a dividing wall member 59 that separates the passageways 46 and 48. Inserts 18 are laser welded in place.

Bolts or other mechanical fasteners can be used to secure manifold 14 to bobbin end pieces 12*a*, 12*b*, etc. Exemplary bolts 150 are shown in the FIG. 13*b* configuration.

Figures 5A, 5B, 5C, 5D, 5E:
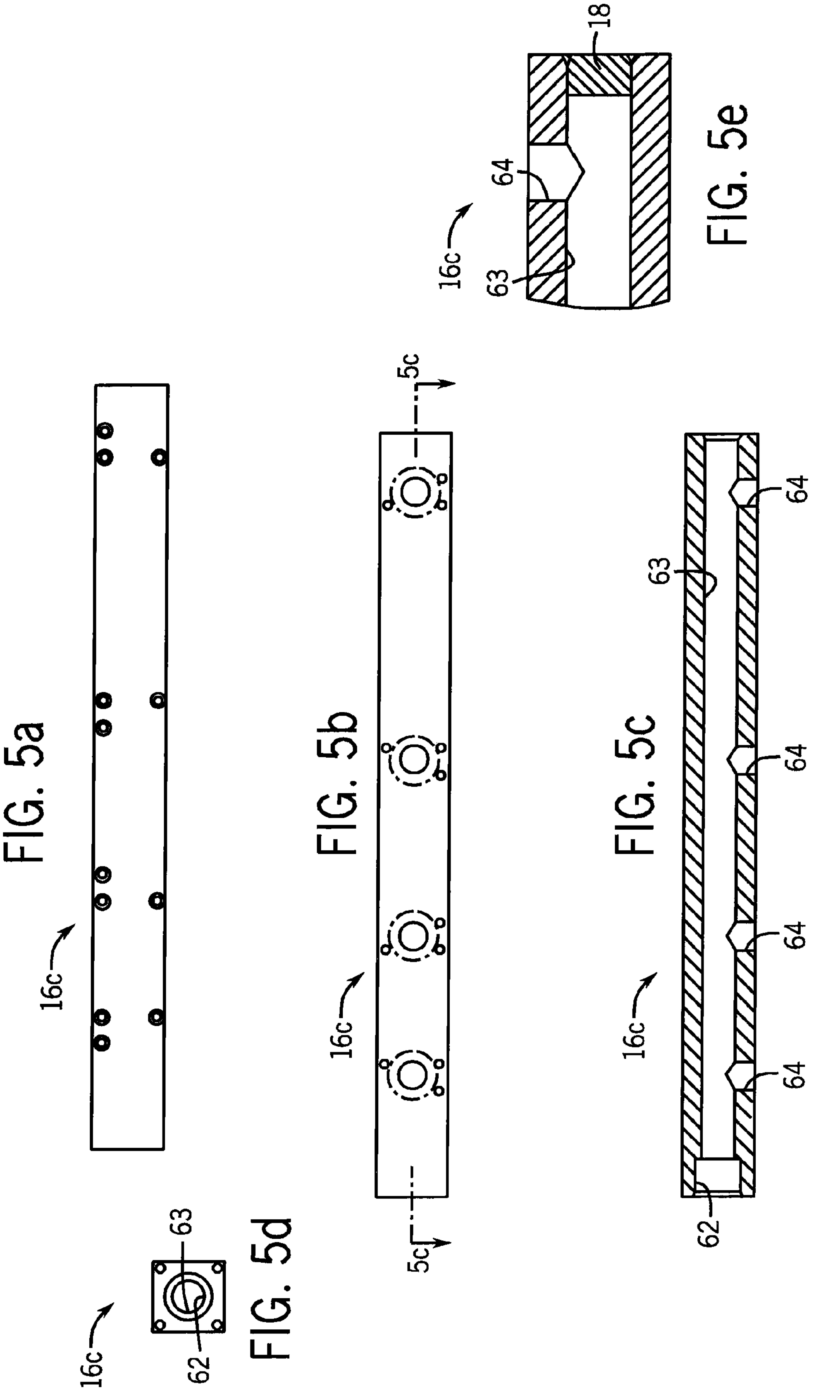
FIG. 5*a* is a top plan view of one of the single flow manifolds shown in FIG. 1.
FIG. 5*b* is a bottom plan view of the manifold of FIG. 5*a*.
FIG. 5*c* is a cross-sectional view taken along the line 5*c*-5*c* in FIG. 5*b*, 5*d* is an end view of the manifold in FIG. 5*a* and FIG. 5*e* is an enlarged cross-sectional view showing an insert installed to block the passageway formed by the manifold shown in FIG. 5*a;*

Referring now to FIGS. 5*a* through 5*e*, exemplary single flow manifold 16*c* has a generally square cross-section and forms a single passageway 63 along its length dimension. Manifold 16*c* can be formed by an extrusion process that forms the square cross-section and single passageway 63. After extrusion, outlet/inlet ports and fastening apertures are machined into manifold 16*c*. To this end, as seen in FIGS. 5*b* and 5*c*, in the illustrated embodiment, four outlets collectively identified by numeral 64 are formed in one of the manifold 16*c* wall members that open into passageway 63 and apertures (see FIGS. 5*a* and 5*b*) and threaded apertures (see FIG. 5*d*) are formed in manifold 16*c* for connecting cooling system components together. Referring to FIG. 5*e*, a metallic plug insert 18 is laser welded into one end of passageway while an opposite inlet end 62 remains open. Manifold 16*d* is similar to manifold 16*c*.

Figure 10:
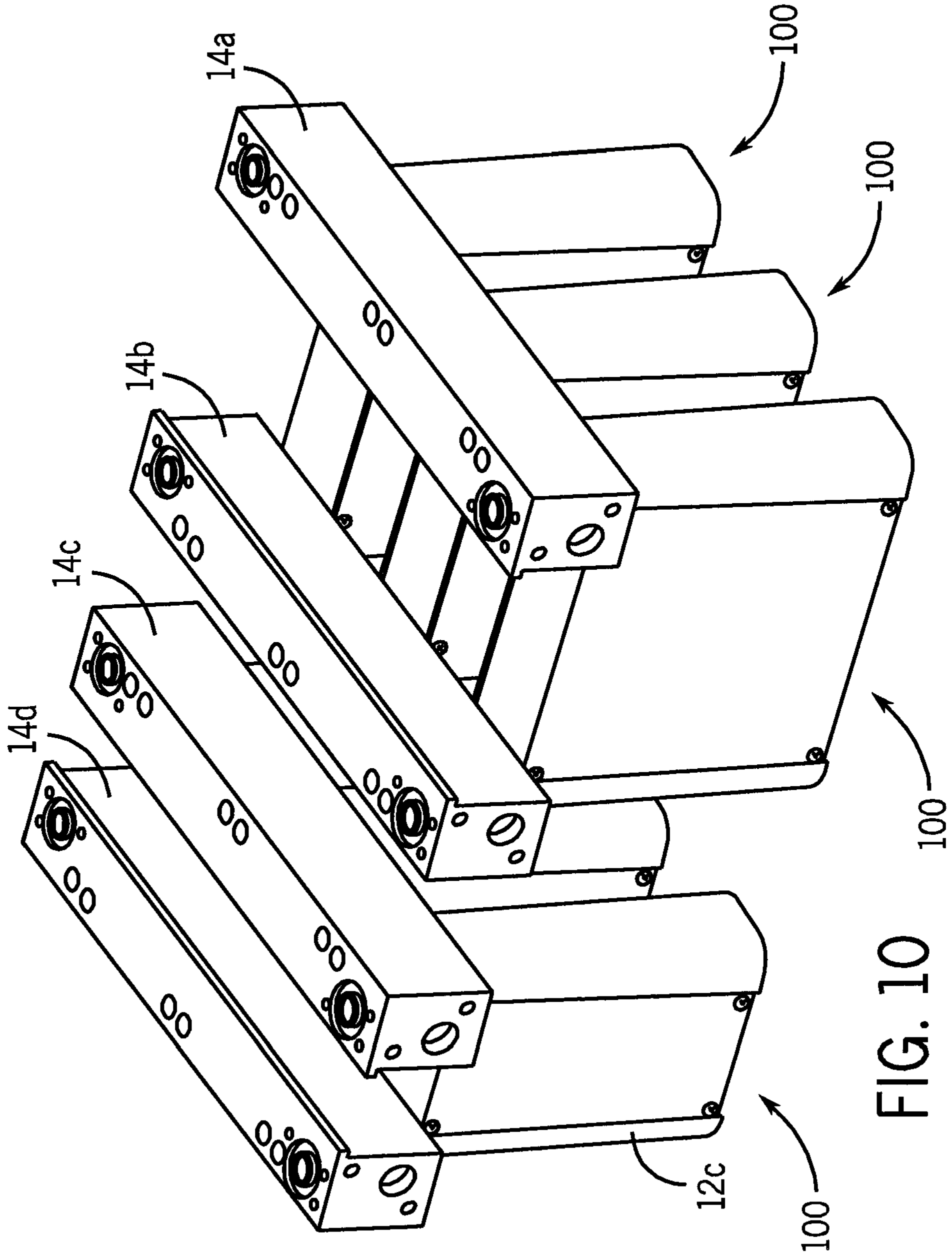
FIG. 10 is a view similar to FIG. 8, albeit where split flow manifolds have been connected to the bobbin assemblies.
Figure 11:
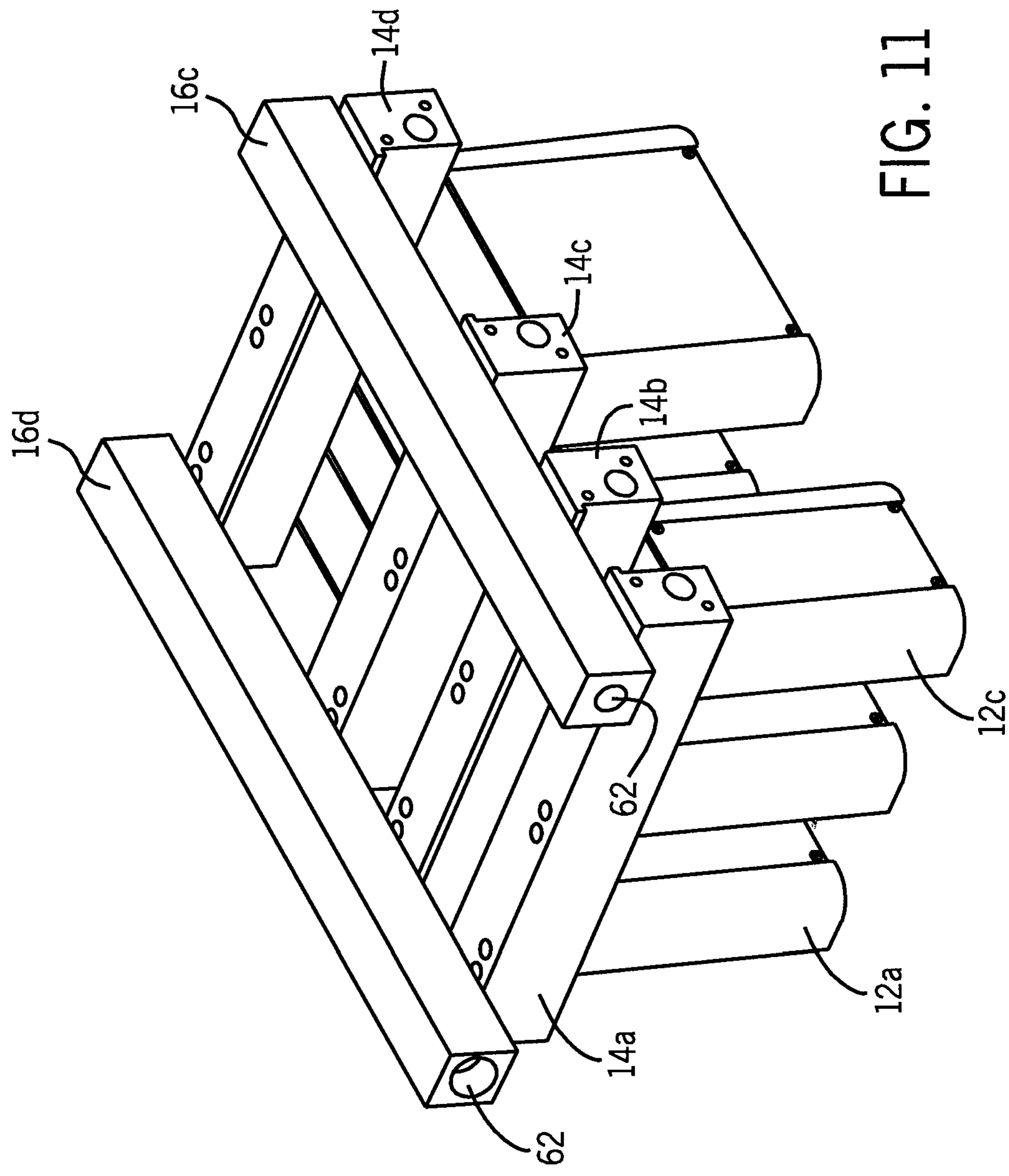
FIG. 11 is similar to FIG. 10, albeit where two single flow manifolds have been connected to the split flow manifold shown in FIG. 10.

Referring to FIG. 11, manifold 16*c* operates as a source manifold and manifold 16*d* operates as a return manifold. To this end, liquid coolant flows into inlet end port 62 (see also FIG. 10*c*) of single flow source manifold 16*c* to be distributed to inlet ports 52 (see FIG. 9*c*) of the plurality of split flow manifolds 14*a*-14*d*, flows through these split flow manifolds 14*a*-14*d* and split flow tubes 12*a*, 12*b*, 12*c*, etc., as described above, then flows out of outlet ports 56 (see again FIG. 4*c*) of the split flow manifolds 14*a*-14*d* to bottom ports 64 of single flow return manifold 16*d* and out of the end port 62 thereof (see also the flow path arrow 154 in FIGS. 1 and 2).

Figure 6D:
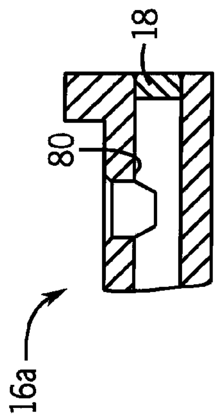
FIG. 6*a* is a side plan view of one of the single flow manifolds shown in FIG. 1.
FIG. 6*b* is a top plan view of the manifold in FIG. 6*a*.
FIG. 6*c* is an end plan view of the manifold in FIG. 6*a* and FIG. 6*d* is an enlarged partial cross-sectional view with an insert installed in a passageway formed by the manifold of FIG. 6*a* to block the passageway.
Figure 6A:
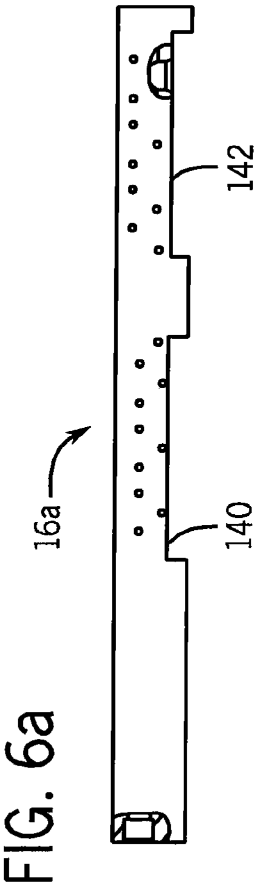
Figure 6B:
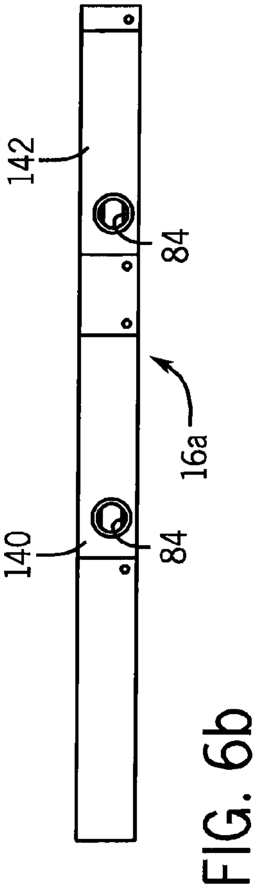
Figure 6C:
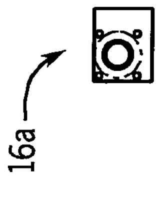

Referring to FIGS. 1, 2 and 6*a*-6*d*, manifold 16*a* is generally rectilinear in cross-section and forms a single passageway 80 along its entire length. Manifold 16*a* is formed via an extrusion process that forms the rectilinear cross-section and passageway 80. After extrusion, ports and mounting apertures as well as recessed mounting surfaces are machines into manifold 16*a*. In this regard, as seen in FIGS. 6*a* and 6*b*, recessed module mounting surfaces 140 and 142 are formed in manifold 16*a* that are dimensioned to, as the label implies, receive portions of modules 25 for mounting purposes. First and second outlet/inlet ports 84 are formed in surfaces 140 and 142 that open into passageway 80 (see FIG. 11*a*). Ports 84 are dimensioned and configured to receive connection head structure 75 of modules 25 (see FIG. 12). A plug insert 18 is laser welded into a closed end of passageway 80 (see FIG. 11*d*). Modules 25 can be screwed to or otherwise mechanically fastened to manifolds 16*a* and 16*b* so that structure 75 is received in ports 84. Manifold 16*b* is similar to manifold 16*a*.

Figure 7C:
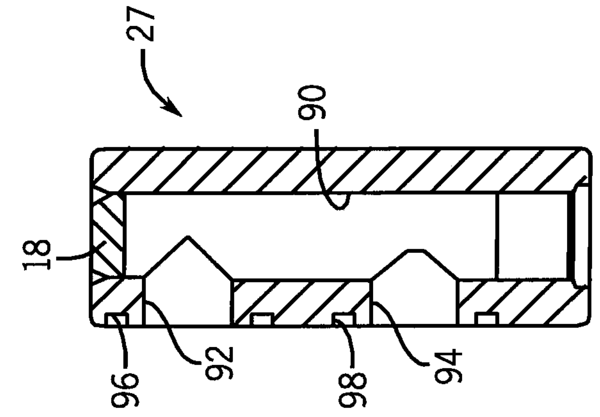
FIG. 7*a* is a front plan view of the manifold link shown in FIG. 1.
FIG. 7*b* is a rear plan view of the manifold of FIG. 7*a* and FIG. 7*c* is a cross-sectional view taken along the line 7*c*-7*c* of FIG. 7*a;*
Figure 7B:
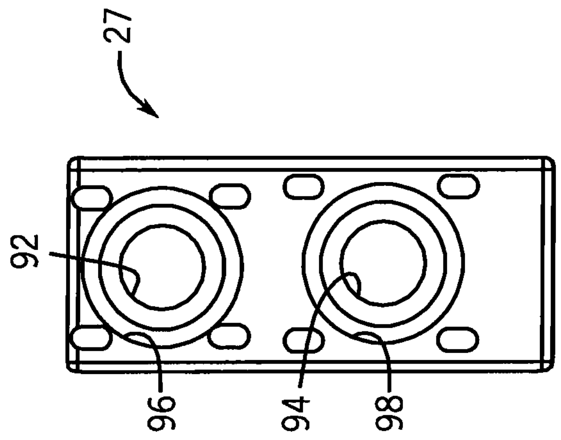
Figure 7A:
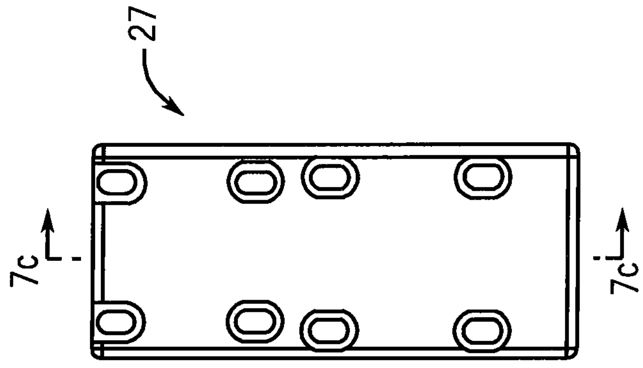

As shown in FIGS. 1 and 2, a connector or manifold link 27 can connect single flow manifold 16*b* to single flow manifold 16*c* at their open end ports. Referring also to FIGS. 7*a* through 7*c*, exemplary link 27 includes an extruded elongated member that is substantially rectilinear in cross-section and that forms a single passageway 90 (see FIG. 12*c*) that extends along the length thereof. After extrusion, mounting holes, ports and O-ring receiving channels are machined into link 27. The ports include an inlet port 92 and an outlet port 94 where O-ring recesses 96 and 98 are formed in an external link surface surrounding ports 92 and 94, respectively. Plug inserts (one shown as 18) may be laser welded at opposite ends of link 27 to close off ends of passageway 90.

Figure 12:
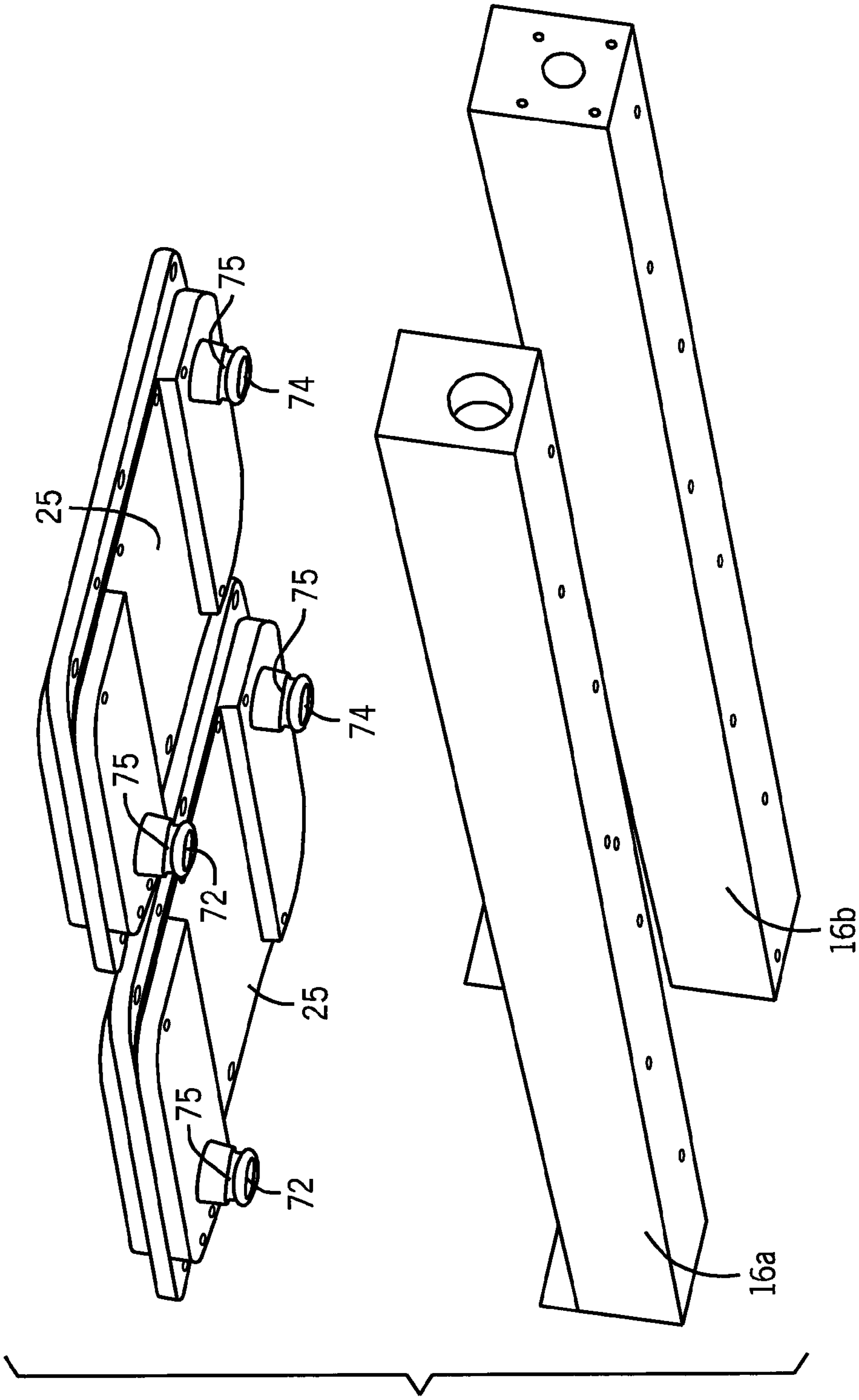
FIG. 12 is a partially exploded view showing two power modules and two single flow manifolds that are consistent with at least some embodiments of the present invention.
Figures 13A, 13B, 13C:
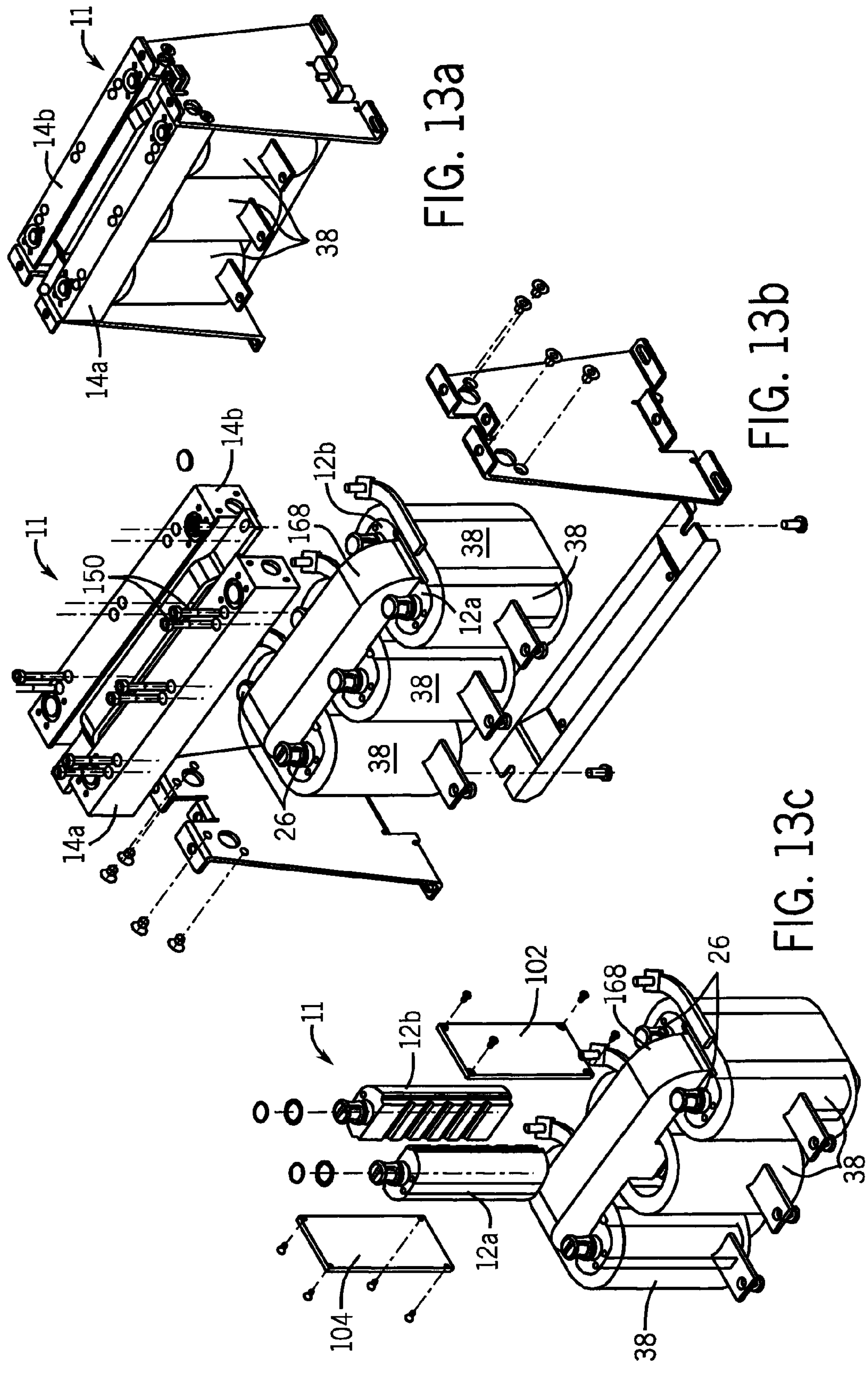
FIG. 13*a* is a perspective view of an inductor assembly and cooling assembly that is consistent with at least some aspects of the present invention.
FIG. 13*b* is an exploded view of the assemblies of FIG. 13*a* and FIG. 13*c* is a partially exploded view of a subset of the components of FIG. 13*a* showing, in particular, an exploded bobbin assembly separated from an associated coil.

Referring to FIG. 12, other electrical components in the form of one or more IGBT modules 25 through which liquid coolant can flow are shown. Each IGBT module 25 includes internal passageways (not shown) with an input port 72 and an output port 74, both formed in connecting head structure 75. The connecting head structure 75 includes a cylindrical extension member and an O-ring mounted thereto for sealing purposes.

Referring now to FIGS. 8,10,11,12 and 1 and 2, to assemble the cooling system 10 shown in FIGS. 1 and 2 after bobbin assemblies 100 (see FIG. 1) have been configured as described above, manifolds 14*a*-14*d* are mounted to the bobbin assemblies (see FIGS. 8 and 10 specifically). Next, single flow manifolds 16*c* and 16*d* are mounted to manifolds 14*a*-14*d* (see FIG. 11) via bolts and so that the ports 64 (see FIG. 5*c*) of manifold 16*c* open into the inlet ports 52 (see FIG. 4*c*) of manifolds 14*a*-14*d* and the ports 64 of manifold 16*d* open into the output ports 56 (see FIG. 4*c*) of manifolds 14*a*-14*d*.

Continuing, referring to FIG. 12, modules 25 are mounted to manifolds 16*a* and 16*b* with structures 75 received in inlet/outlet ports 84 (see FIG. 6*b*) and then manifolds 16*a* and 16*b* are mounted adjacent/above manifolds 16*c* and 16*d*. Referring to FIGS. 1 and 2, link 27 is mounted to adjacent open ends of manifolds 16*b* and 16*c* thereby connecting passageways 80 and 63 via link passageway 90 (see also FIGS. 5*c*, 6*d* and 7*c*).

Referring to FIGS. 1 and 2, in operation, liquid coolant is directed along the path indicated by arrow 154 into input port 85 of single flow manifold 16*a*, flows through manifold 16*a* and out multiple output ports 84 (see FIG. 11*b*), travels through IGBT modules 25 to cool those modules, exits the IGBT modules 25 to single flow manifold 16*b* via ports 84 (see FIG. 6*b*), then travels through manifold 16*b* out an output port to link 27, to an input port 62 of single flow manifold 16*c*. As shown in FIG. 2, coolant from single flow manifold 16*c* feeds first passageways 46 (see FIG. 4*d*) of split flow manifolds 14*a*-14*d*, then flows into and out of split flow tubes 12*a*, 12*b*, etc., back to second passageways 48 of split flow manifolds 14*a*-14*d* (see FIG. 4*e*), and then to the single flow manifold 16*d*, from which the liquid coolant exits from a single port 62.

Referring now to FIGS. 13*a*-13*c*, the second exemplary inductor/cooling configuration 11 includes three inductor coils 38 and a core assembly 168 as well as a cooling assembly. The cooling assembly includes a separate bobbin assembly 100 (e.g., end pieces 12*a*, 12*b* and separator plates 102 and 104) for each coil 38, first and second split flow manifolds 14*a*, 14*b* and seals, screws, etc. Once assembled, two bobbin end piece connection head portions 26 extend upward from each coil 38. Split flow manifolds 14*a*, 14*b* mount to the bobbin end pieces (see FIG. 12*b*) via bolts 150 for delivering cooling liquid to the split flow tubes (e.g., the bobbin end pieces 12*a*, 12*b*, etc.). Although not labeled, bracket components are shown for securing various system components together.

Thus, it should be appreciated that a simple and relatively inexpensive kit of parts has been described that can be used to configure many different cooling system configurations to cool various electronics and heat generating component configurations. The kit includes parts that seal together using simple mechanical fasteners and therefore cooling configurations can be constructed without requiring soldering and welding skills.

Cooling kits such as the exemplary one described above can be simply assembled and/or scaled to provide a system to for cooling many other types and/or numbers of electrical components. For example, bobbins 100 and split flow manifolds 14*a* and 14*b* have been shown in two different configurations 10 and 11 above. The kit of components described above may be configured in many other assemblies.

This has been a description of a preferred embodiment of the invention. It will be apparent that various modifications can be made without departing from the scope and spirit of the invention, and these are intended to come within the scope of the following claims.

We claim:

1. A modular cooling system comprising:

at least a first passageway forming member and a second passageway forming member, each of the first and second passageway forming members having first and second ends and forming at least one passageway and at least one of an input port and an output port that opens into the passageway;

the second passageway forming member including first and second passageways, a bridge passageway adjacent the second end of the second passageway forming member that links the first and second passageways and an inlet into the first passageway and an outlet into the second passageway, where the inlet and outlet are both proximate the first end of the second forming member; and the first passageway forming member including at least one connecting recess that opens into the first and second passageways formed by the first passageway forming member, the first end of the second passageway forming member being receivable in the connecting recess, such that the inlet and outlet of the second passageway forming member open into the at least one passageway formed by the first forming member when the first end of the second passageway forming member is received in the connecting recess.

2. The system of claim 1 wherein each of the first and second passageway forming members also includes at least a first plug insert secured to the second end of each passageway forming member to block the at least one passageway at the second end.

3. The system of claim 1 further including a plurality of elastomeric seals and a plurality of mechanical fasteners, the mechanical fasteners to mechanically fasten the first passageway forming member and the second passageway forming member together; and wherein the first passageway forming member input port, at least one of the plurality of elastomeric seals, and the second passageway forming member output port are arranged in substantial structural alignment with each other such that the at least one of the plurality of elastomeric seals is positioned between and in substantial contact with both the first passageway forming member and the second passageway forming member to create a sealed flow path between the first passageway forming member input port and the second passageway forming member output port.

4. The system of claim 1 wherein the first passageway forming member includes a plurality of connecting recesses that open into the first and second passageways formed by the first passageway forming member, and wherein each of the connecting recesses can receive a first end of a second passageway forming member so that the inlet and outlet of the received second passageway forming member opens into the first and second passageways formed by the first passageway forming member.

5. The system of claim 1 wherein at least a subset of the first and second passageway forming members form a single passageway and include both an inlet and an outlet that open into the single passageway.

6. The system of claim 1 wherein the passageways are formed along lengths of the first and second passageway forming members, and wherein the first and second passageway forming members include at least one of an inlet and an outlet that opens through a side wall portion of at least one of the first and second passageway forming members into at least one of the passageways.

7. The system of claim 1 wherein at least a subset of the first and second passageway forming members include external surfaces that form O-ring receiving channels for receiving at least one of a plurality of elastomeric seals when the first and second passageway forming members are secured together.

8. The system of claim 1 to cool at least one electrical component, the electrical component including a coil having a plurality of turns disposed over at least one of the first and second passageway forming members.

9. The system of claim 1 wherein the first passageway forming member includes a circular recess in the first external surface and wherein the at least one elastomeric seal is placed in the circular recess.

10. The system of claim 9 wherein the elastomeric seal comprises an elastomeric O-ring.

11. The system of claim 1 wherein the first passageway forming member includes first and second passageways.

12. The system of claim 11 wherein the inlet and outlet of the second passageway forming member open into the first and second passageways formed by the first forming member.

13. The system of claim 12 wherein the first forming member includes an inlet that opens into the first passageway formed by the first passageway forming member and an outlet that opens into the second passageway formed by the first forming member, and wherein the first and second passageways are completely separate.

14. The system of claim 13 wherein the first passageway forming member includes first and second oppositely facing surfaces, and wherein the inlet and outlet are formed in the first surface and the connecting recess is formed in the second surface.

15. The system of claim 1 wherein the first end forms a cylindrical connection head portion through which the first and second passageways pass.

16. A cooling system comprising:

a first passageway forming member including first and second ends and at least one connecting recess that opens into first and second passageways formed by the first passageway forming member; and a second passageway forming member including first and second ends and inlet and outlet ports proximate the first end such that the first end, including an elastomeric seal and the inlet and outlet ports, is sealably insertable in and removable from the at least one connecting recess, where the inlet port opens into the first passageway and the outlet port opens into the second passageway, and where, when the first end is inserted in the at least one connecting recess, the elastomeric seal is sandwiched between and in substantial contact with both the first end and the first passageway forming member.

17. The system of claim 16 wherein at least one of the first and second passageway forming members are substantially rectilinear in cross section.

18. The system of claim 16 further including a plurality of mechanical fasteners to mechanically fasten the first forming member and the second forming member together.

19. The system of claim 16 wherein the second passageway forming member includes first and second passageways, and each of the first and second passageway forming members also includes at least a first plug insert secured to the second end of each passageway forming member to block the first and second passageways at the second end.

* * * * *